(12) United States Patent
Russat et al.

(10) Patent No.: US 6,531,935 B1
(45) Date of Patent: Mar. 11, 2003

(54) VECTOR MODULATOR

(75) Inventors: Jean Russat, Senart (FR); Nicolas Fel, Alfut (FR)

(73) Assignee: Commissariat a l'Energie Atomique, Paris (FR)

(*) Notice: Subject to any disclaimer, the term of this patent is extended or adjusted under 35 U.S.C. 154(b) by 0 days.

(21) Appl. No.: 09/719,809

(22) PCT Filed: Jul. 8, 1999

(86) PCT No.: PCT/FR99/01660

§ 371 (c)(1),
(2), (4) Date: Mar. 5, 2001

(87) PCT Pub. No.: WO00/03475

PCT Pub. Date: Jan. 20, 2000

(30) Foreign Application Priority Data

Jul. 10, 1998 (FR) .............................................. 98 08918

(51) Int. Cl.$^7$ .............................................. H01P 1/18
(52) U.S. Cl. ......................... 333/139; 332/170; 332/44
(58) Field of Search .......................... 333/139; 332/170, 332/44

(56) References Cited

U.S. PATENT DOCUMENTS

| 3,411,110 A | | 11/1968 | Walker et al. |
| 4,384,366 A | * | 5/1983 | Kaitsuka ..................... 455/278 |
| 5,631,610 A | | 5/1997 | Sandberg et al. |

FOREIGN PATENT DOCUMENTS

| GB | 2064246 | 6/1981 |
| GB | 2240890 | 8/1991 |

OTHER PUBLICATIONS

Pat Hawker, "Technical Topics" *Radio Communication*, Dec. 1973, pp. 852–857 SP002097316.
"Advanced Technologies Pave the Way for Photonics Switches", Rod. C. Alferness (Laser Focus World, Feb. 1995, pp. 109 to 113.
The Art of Electronics by Paul Horowitz and Winfield Hill (Cambridge University Press, Section Edition, 1989, chapter 5: "Active Filters and Oscillators", figure 5.41).
"Radio Amateur's Handbook" by Frederick Collins and Robert Hertzeberg (15$^{th}$ ed. Rev., 1983, pp. 12–8 and 12–9).

* cited by examiner

Primary Examiner—Benny Lee
Assistant Examiner—Damian E. Cathey
(74) Attorney, Agent, or Firm—Thelen Reid & Priest LLP; Robert E. Krebs

(57) ABSTRACT

An analogue phase shifter with vector modulator is envisioned. The analogue phase shifter has an input stage that provides the generation of a pseudo-basis of four vectors. The analogue phase shifter has a multiphase filter. The analogue phase shifter has an output stage that controls the amplitde of the basis vectors, and acts to recombine them. The input stase is made with a phase opposition signal generator and a multiphase filter. The input stase is made of four variable attenuators. The attenuators are for separate control of the amplitude of each of the basis vectors. The output stage also has a common output providing the summation of four quadrature channels. In one case, the output stage includes two differential amplifiers. In another case the quadrature channels are connected to the common output through buffer amplifier stages, each followed by a summation capacitor.

2 Claims, 5 Drawing Sheets

VECTOR MODULATOR

This application is a national phase of PCT/FR99/01660 which was filed on Jul. 8, 1999, and was not published in English.

DESCRIPTION

1. Technical Field

The present invention concerns a vector modulator.

2. State of Prior Art

Electrical signal phase shifting may be digital, with phase jumps, or analogue, with continuous phase variation.

Digital phase shifters use PIN-diodes or field effect transistors, used as electronic switches, allowing switching between transmission lines of different lengths (phase shifting by propagation/transmission delay) or else between sections of filtering structures of the low-pass/high-pass type, for example.

The use of varactor diodes or field effect transistors as continuously variable impedances allows analogue phase shifters to be made, providing wave phase shifting in transmission, as in vector modulators, or else in reflection, as in diode phase shifters.

In a diode phase shifter, as shown in FIG. 1, the phase and quadrature outputs of the hybrid coupler 10 are charged by variable reactive elements. The variation in reactive impedance relative to the characteristic impedance (generally 50Ω) entails a variation in the phase of the output signal S by means of a complex reflection coefficient Γ.

The following signals are obtained:

$$\text{Input} \quad \sin(\omega t)$$
$$\text{Output } O: \quad \Gamma \sin(\omega t)$$
$$\text{Output} -90°: \quad -\Gamma \cos(\omega t)$$
$$\text{Output } S: \quad -\Gamma \cos(\omega t) = |\Gamma|\sin(\omega t) + \varphi),$$

$$\text{with} \quad \tan\left(\frac{\varphi}{2}\right) = \frac{1-\Gamma}{1+\Gamma}$$

Diode phase shifters essentially use voltage controlled varactors for continuous phase shifting, or switch operated PIN-diodes for digital phase shifting.

In principle, hybrid ring or square couplers or transformers may equally well be used. The band width of the phase shifters thus constituted is limited by the use of a coupler: these devices are typically narrow band, or operate at best on a two-octave band: $\omega \to 4\omega$.

Vector modulators use the principle of addition of variable amplitude orthogonal vectors (I/Q).

In a vector modulator phase shifter, phase shifting between the input signal E and the output signal S is the result of recombining (11) two separately attenuated quadrature components. An example of a 0–90° phase shifter with vector modulator is given in FIG. 2, with I and Q controls.

The record of the signals taken at the different points of the phase shifter is as follows:

$$\text{Input } E: \quad \sin(\omega t)$$
$$\text{Output } 0°: \quad \sin(\omega t)/\sqrt{2}$$
$$\text{Output} -90°: \quad \sin(\omega t - \pi/2)/\sqrt{2} = -\cos(\omega t)/\sqrt{2}$$
$$\text{Point } A: \quad a\sin(\omega t)/\sqrt{2}$$
$$\text{Point } B: \quad -b\cos(\omega t)/\sqrt{2}$$
$$\text{Output } S: \quad [a\sin(\omega t) + b\cos(\omega t)]/\sqrt{2} = \cos(\omega t + \varphi)$$

if $a = \cos\varphi$ and $b = \sin\varphi$

These arrangements providing phase shifting over one quadrant, a 0–360° phase shifter is obtained by combining 90° hybrid couplers 10 and 180° hybrid couplers 12, as shown in FIGS. 3A, 3B or 3C, or else by cascading four 0–90° cells. The circuit bearing the reference 13 is a ¼ phase splitter and the circuits bearing the reference 14 are 4:1 phase combiners.

These different phase shifters are all based on the generation of phase quadrature signals, by using and combining 90° hybrid couplers. On principle, the 90° hybrid couplers have a band width extending at most to about two octaves. It is therefore the same for the phase shifters thus constituted.

The article bearing the reference [1] at the end of the description describes structures of this type and particularly that of a vector modulator.

The object of the invention is to overcome the drawbacks of the prior art arrangements by proposing a new type of vector modulator.

DISCLOSURE OF THE INVENTION

The present invention concerns a vector modulator, characterised in that it includes:

an input stage providing the generation of a pseudo-basis of four vectors (±I, ±Q), and comprising a multiphase filter;

an output stage making it possible to control the amplitude of the basis vectors, and to recombine them.

The input stage comprises successively:

a phase opposition signal generator;

a multiphase filter or network.

The output stage comprises:

four variable attenuators making it possible to achieve separate control of the amplitude of each of the basis vectors;

a common output providing the summation of the four quadrature channels.

To advantage the output stage includes two differential amplifiers isolating the variable attenuators from the multiphase filter/network. The quadrature channels are connected to the common output through buffer amplifier stages each followed by a summation capacitor.

The potential applications for this type of vector modulators are varied:

formation of beams (antenna arrays, antenna and synthetic aperture radar etc.);

high speed communications, frequency and angular multiplexing (satellite communications, digital television, WDM switchboard (see documents bearing the references [2] and [3] at the end of the description) etc.);

instrumentation (correlator, phase discriminator, vector analyser, etc.)

Such a modulator may be used, in fact, for the transmission of single side-band (SSB), or even suppressed carrier single side-band signals. Such transmission modes are appropriate for satellite communications, digital television, or telephony. The principle consists in transposing the frequency of the signal wanted to encode a carrier, so as to meet electromagnetic spectrum congestion or transmission quality criteria. It may also be used in antenna arrays or synthetic aperture radar: beam scanning by phase scanning.

In the case of digital television, there are two successive encodings: encoding the video image, then carrier modulation to 12 Ghz etc. By extrapolating such an embodiment, an analogous embodiment in optics may thus be conceived: hence the WDM modulation.

However, applications, functions or systems exploiting phase quadrature signals in a very wide frequency band (correlator, network analyser, phase discriminator, etc.) are particularly attractive.

BRIEF DESCRIPTIONS OF THE DRAWINGS

DETAILED DISCLOSURE OF THE EMBODIMENTS

Figure 2:
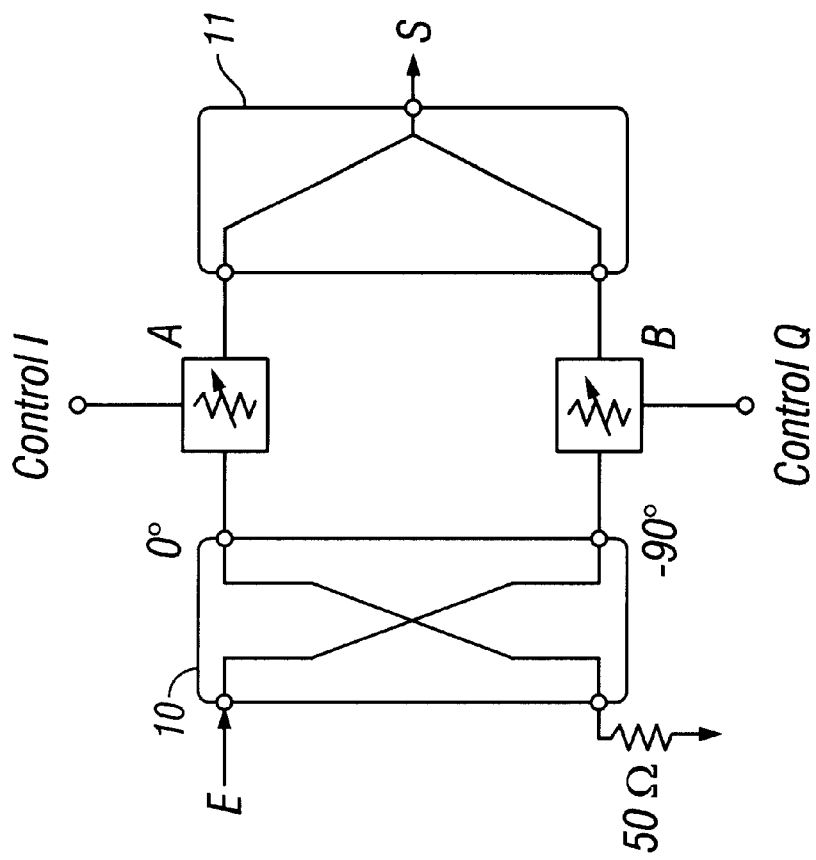
FIG. 2 shows a prior art 0–90° phase shifter with vector modulator.
Figure 1:
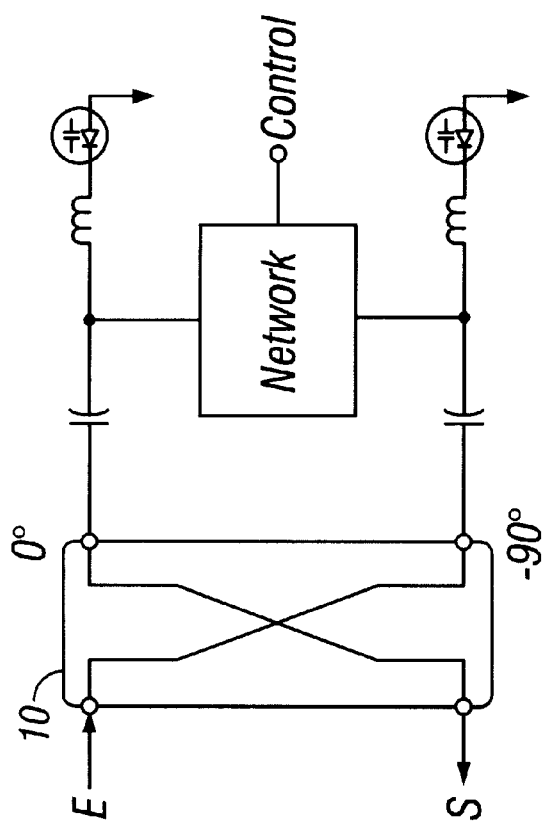
FIG. 1 shows a prior art 0–90° phase shifter with varactors.
Figure 3A:
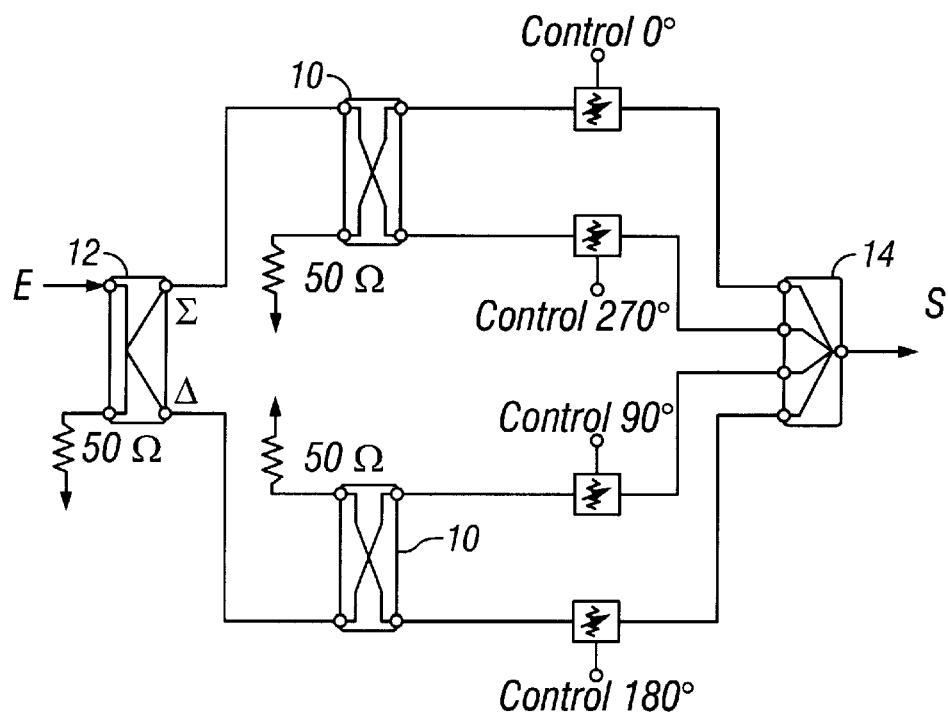
FIGS. 3A, 3B and 3C show prior art 0–360° phase shifters by vector modulator.
Figure 3B:
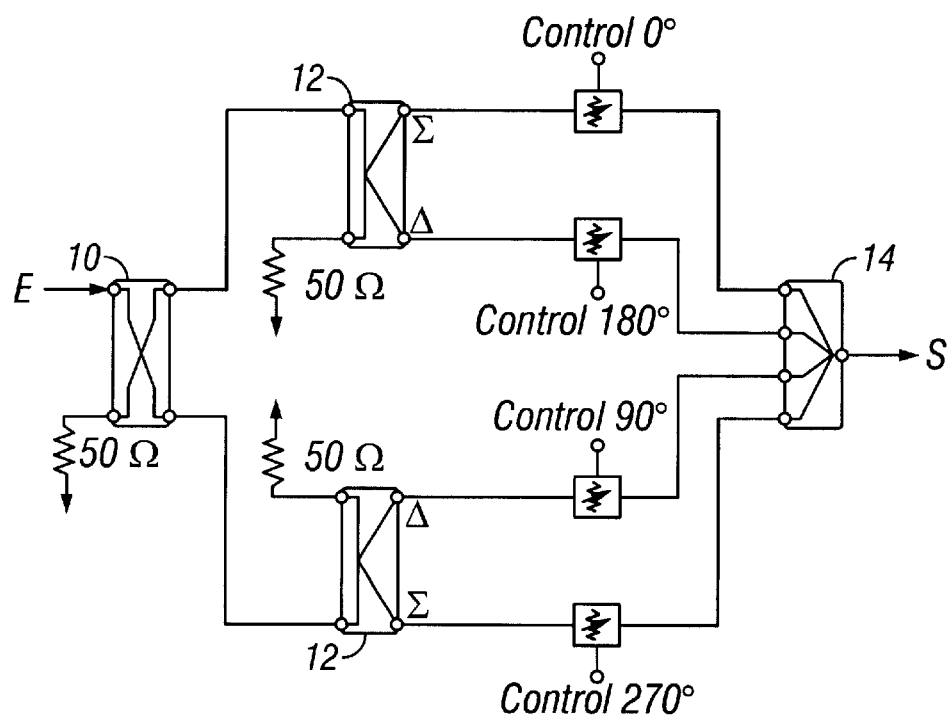
Figure 3C:
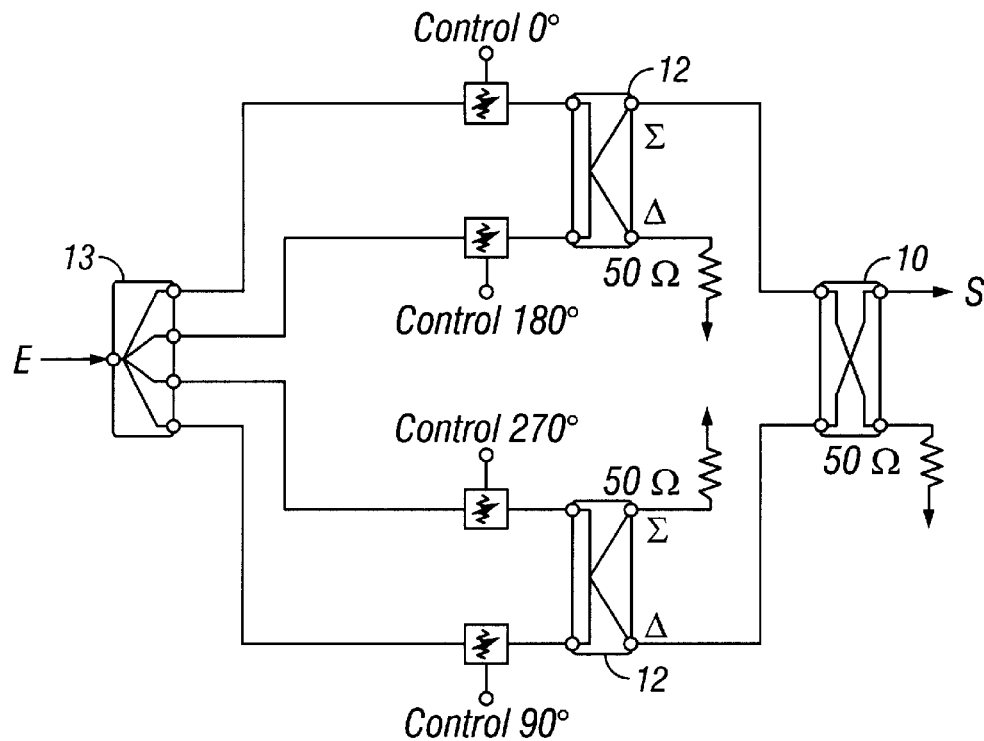
Figure 4:
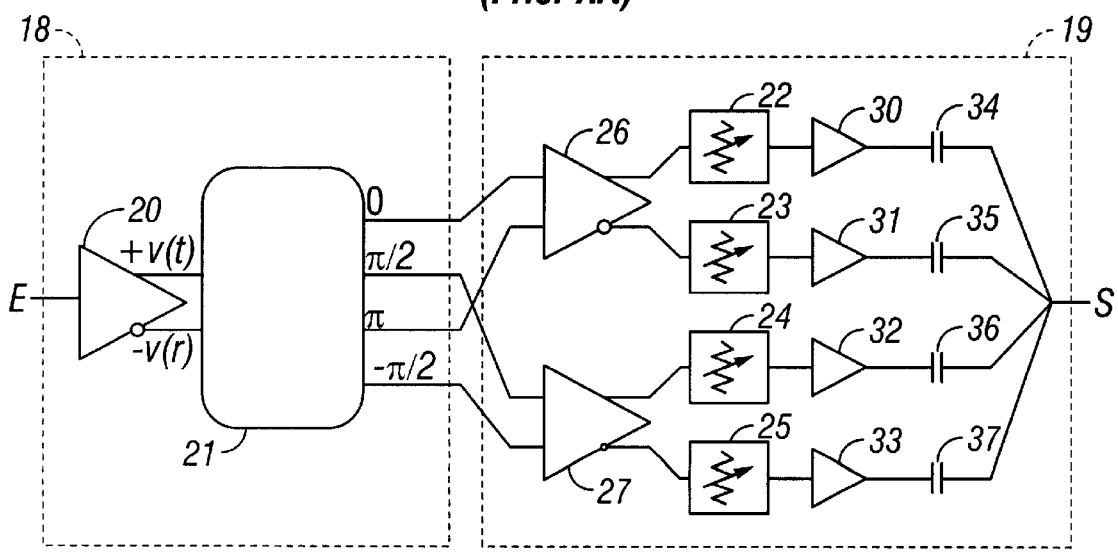
FIG. 4 shows the vector modulators according to the invention.

The present invention is based on the principle of a multiphase filter vector modulator, as shown in FIG. 4.

This modulator comprises:
an input stage 18 providing the generation of a pseudo-basis of four vectors (±I, ±Q);
and an output stage 19 making it possible to control the amplitude of the basis vectors, and to combine them.

The input stage 18 comprises successively:
a generator 20 of phase opposition signals +v(t) and −v(t), which may be any device supplying two signals out-of-phase by 180°: a transformer, a 180° hybrid coupler. An advantageous solution uses a one or several stage differential amplifier, for its large band width and for accuracy in obtaining signals out-of-phase by 180°;
a multiphase filter or network 21.

Figure 5A:
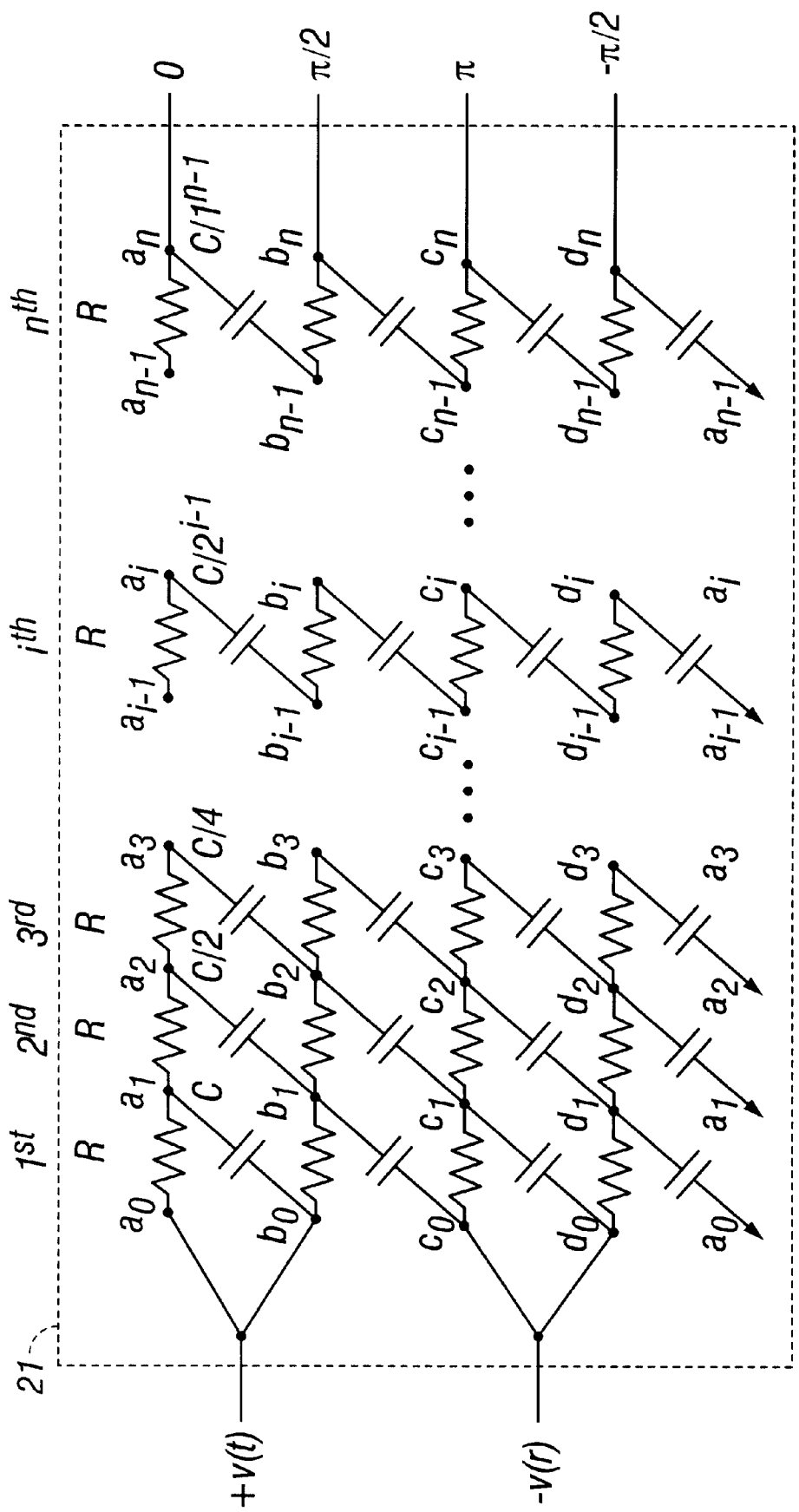
FIGS. 5A and 5B show respectively a multiphase network structure with n sections, and the quadrature deviation between the I/Q vectors as a function of the reduced frequency f×2πRC for n variant of 1 to 5 sections.

The multiphase filter/network structure, as shown in FIG. 5A, is used in the field of audio-frequencies (~300–3000 Hz), to make single side-band modulators. It consists preferentially of a cyclical and repetitive structure based on equal resistors (R) and capacitors (C, C/2 to $C/2^{i-1}$, to $C/2^{n-1}$) decreasing geometrically, as shown in FIG. 5A.

The multiphase filter/network 21 output delivers a pseudo-basis of four orthogonal vectors in twos (±I, ±Q).

The multiphase filter/network 21 frequency response may be described by a characteristic frequency which shows the low frequency of use: $f_0 = \frac{1}{2}\pi RC$.

The band width for a given quadrature error 80 increases with the number of sections.

Figure 5B:
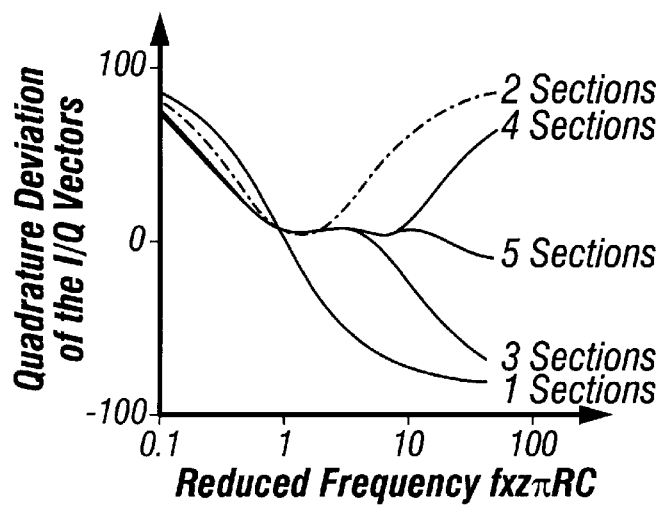

FIG. 5B shows the quadrature deviation between the I and Q vectors as a function of the reduced frequency f×2πRC for n variant of 1 to 5 sections.

The output stage 19 comprises:
four variable attenuators 22, 23, 24 and 25 making it possible to obtain separate control of the amplitude of each of the basis vectors; to advantage these attenuators 22, 23, 24 and 25 may be isolated from the multiphase filter/network 21 by two differential amplifiers 26 and 27, so as to minimise the influence of the variations in charge on the overall behaviour of the modulator;
a common output S providing the summation of the four quadrature channels; these four quadrature channels may thus be connected to the common output port S through buffer amplifier stages 30, 31, 32 and 33 followed by summation capacitors 34, 35, 36 and 37.

The output stage 19 may comprise equally well any structure making it possible to modify separately the amplitude of the basis vectors (mixers, variable gain amplifiers for example).

Figure 6A:
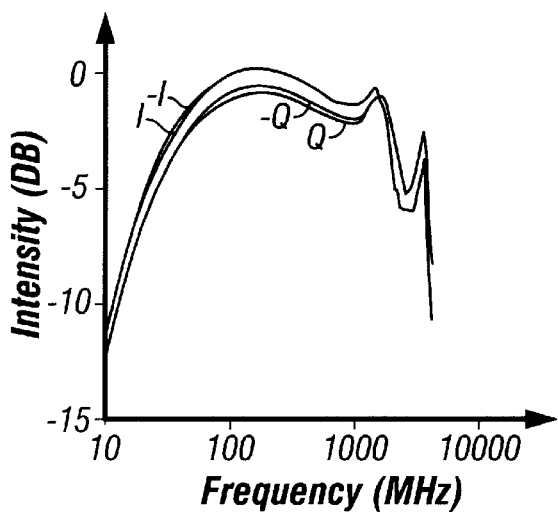
FIGS. 6A and 6B show respectively the transfer function S21 of four basis vectors +I, −I, +Q, −Q, and the phase error relative to a perfect quadrature between the vectors I and ±Q, and a perfect phase opposition between the vectors +I and −I, obtained on a vector modulator comprising a four section multiphase filter.

FIG. 6A shows the transfer function S21 when each of the four basis vectors +I, −I, +Q, and −Q is successively selected. Measurement is carried out between 10 MHz and 3000 MHz. The band width at −3 dB of each of these vectors is of the order of 30 MHz–1500 MHz (that is a ratio of 50 to 1), which is also the band width of the vector modulator. Its operating band for a given phase error (for example ±5°) is slightly lower (~80 MHz–1300 MHz at ±5°).

Figure 6B:
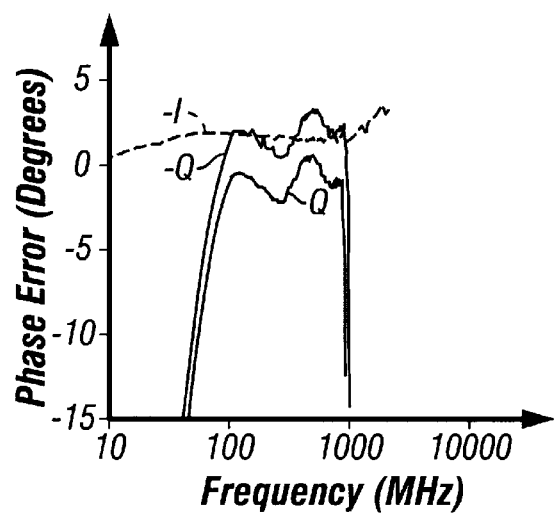

FIG. 6B shows the phase error relative to a perfect quadrature between I and ±Q, and to a perfect phase opposition between I and −I.

REFERENCES

[1] <<Microwave Components and Subsystems>> (Anaren, Proven Performance in Signal Processing, pp.108–115 and 125–129)

[2] <<Advanced Technologies Pave The Way For Photonic Switches>> by Rod C. Alferness (Laser Focus World, February 1995, pp.109 to 113)

[3] <<Wavelength-Division Multiplexing Technology in Photonic Switching>> by Masahiko Fujiwara and Shuji Suzuki (<<Photonic Switching and Interconnects>> by Abdellatif Marrakchi, Marcel Dekker, Inc., pp. 77–113)

[4] <<The Art of Electronics>> by Paul Horowitz and Winfield Hill (Cambridge University Press, Second Edition, 1989, chapter 5: <<Active Filters and Oscillators>>, FIG. 5.41)

[5] <<Radio Amateur's Handbook>> by Frederick Collins and Robert Hertzeberg ($15^{th}$ ed. Rev., 1983, pp.12–8 and 12–9)

What is claimed is:

1. An analogue phase shifter with vector modulator comprising:
an input stage, providing the generation of a pseudo-basis of four vectors and comprising a multiphase filter;
an output stage, for controlling the amplitude of the basis vectors, and to recombine them;
the input stage comprising:
a phase opposition signal generator; and
a multiphase filter;
the input stage comprising:
four variable attenuators for separate control of the amplitude of each of the basis vectors;

a common output providing the summation of four quadrature channels; and wherein the output stage includes two differential amplifiers isolating the variable attenuators from the malliphase filter.

2. An analogue phase shifter with vector modulator comprising:
   an input stage, providing the generation of a pseudo-basis of four vectors and comprising a multiphase filter;
   an output stage, for controlling the amplitude of the basis vectors, and to recombine them;
   the input stage comprising:
      a phase opposition signal generator; and
      a multiphase filter;
   the input stage comprising:
      four variable attenuators for separate control of the amplitude of each of the basis vectors;
      a common output providing the summation of four quadrature channels; and wherein the quadrature channels are connected to the common output trough buffer amplifier stages, each followed by a summation capacitor.

* * * * *